US007528062B2

(12) United States Patent
Miller et al.

(10) Patent No.: US 7,528,062 B2
(45) Date of Patent: May 5, 2009

(54) INTEGRATED MATCHING NETWORK AND METHOD FOR MANUFACTURING INTEGRATED MATCHING NETWORKS

(75) Inventors: Melvy F. Miller, Tempe, AZ (US); Juergen A. Foerstner, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 188 days.

(21) Appl. No.: 11/586,807

(22) Filed: Oct. 25, 2006

(65) Prior Publication Data

US 2008/0099800 A1  May 1, 2008

(51) Int. Cl.
*H01L 21/44* (2006.01)
*H01L 23/52* (2006.01)
(52) U.S. Cl. ..................... 438/614; 257/777
(58) Field of Classification Search .............. 333/253, 333/263; 257/531, 532, 723–728, 777, 782; 438/118, 121, 611–615

See application file for complete search history.

(56) References Cited

U.S. PATENT DOCUMENTS

| 5,138,436 | A | * | 8/1992 | Koepf | 257/728 |
| 5,646,828 | A | | 7/1997 | Degani et al. | |
| 5,880,517 | A | * | 3/1999 | Petrosky | 257/577 |
| 6,646,321 | B2 | * | 11/2003 | Roodnat | 257/516 |
| 7,049,692 | B2 | * | 5/2006 | Nishimura et al. | 257/686 |

* cited by examiner

*Primary Examiner*—Calvin Lee
(74) *Attorney, Agent, or Firm*—Ingrassia, Fisher & Lorenz, P.C.

(57) ABSTRACT

An integrated matching network and method for manufacturing an integrated matching network are provided. The method includes forming (405) a first die on a substrate, forming (410) a second die on the substrate, and forming (415) a metallization layer on the first and second dies. The second die has a capacitance, the metallization layer has an inductance, and the capacitance and inductance together provide a shunt impedance from the first die to the substrate. The integrated matching network includes a first die having a PA (101), a second die having a capacitor (102), and a metal interconnect (108) coupled to the PA and the first capacitor. The metal interconnect (108) has an inductance. The capacitor (102) and metal interconnect (108) form a shunt impedance.

20 Claims, 2 Drawing Sheets

INTEGRATED MATCHING NETWORK AND METHOD FOR MANUFACTURING INTEGRATED MATCHING NETWORKS

FIELD OF THE INVENTION

The present invention generally relates to electronic devices that receive and transmit a signal and, more particularly, relates to methods and systems for integrating electronic devices for impedance matching.

BACKGROUND OF THE INVENTION

In many communication base stations, power amplifiers are used to boost the amplitude of relatively weak communication signals. These power amplifiers typically rely on matching circuits, which generally include capacitor and inductor elements, to match the impedances of the power amplifier to other radio components. Traditional integration of power amplifier (PA) matching network inductances at lower frequencies (e.g., less than or equal to about 2.0 GHz) involves the use of wirebonds, wherein the inductance is proportional to the wire length. With increasing frequencies, these inductances typically become smaller, and the control of wirebond length generally becomes more difficult. For example, as the inductance decreases and the wirebond length decreases, reproducibility becomes more difficult.

One recent technique uses integrated passive devices (IPDs) to place a portion of the inductance onto a thin-film substrate. With this technique, reproducibility may improve, but wirebond variance remains (e.g., the IPD inductor remains connected to the PA via the wirebond). Additionally, higher frequency base station PA devices may rely on GaAs technologies, which generally have poor heat dissipation properties. To compensate, thinner PA dies are typically used, which generally impacts the printed inductor performance.

Accordingly, improved systems and methods for integrating matching networks are desired. More particularly, in some examples, systems and methods for integrating passive networks in electronic devices are desired that improve reproducibility while increasing the frequency response quality. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

The invention may be described herein in terms of functional and/or schematic components. It should be appreciated that such components may be realized in any number of practical ways. For example, an embodiment of the invention may employ various elements, e.g., conductive traces, integrated passive devices, semiconductor substrate materials, dielectric materials, or the like, which may have characteristics or properties known to those skilled in the art. In addition, those skilled in the art will appreciate that the present invention may be practiced in conjunction with any number of practical circuit topologies and applications, and that the circuits described herein in conjunction with the inventive impedance matching circuits are merely exemplary applications of the invention.

According to various embodiments, integrated matching networks and methods for manufacturing integrated matching networks are provided. In one embodiment, systems and methods are provided for integrating passive networks with a radio frequency (RF) active component (e.g., base station power amplifiers (PAs)). While the integrated matching networks and methods for manufacturing integrated matching networks are described with respect to RF active components, other integrated electronic circuits may be used. The system comprises a substrate, a first die formed on the substrate having an RF active component, a second die formed on the substrate having a shunt capacitor, and a metal inductive interconnect coupling an output of the RF active component and an input of the shunt capacitor. Using the inductive interconnect, performance variance normally associated with wirebonds used in conventional integrated matching networks is minimized. In an exemplary embodiment, bump attachments (e.g., bump interconnect or bump die attach) are used to couple the inductive interconnect with the output of the RF active component and the input of the shunt capacitor. Although bump attachments are used to couple the inductive interconnect with the output of the RF active component, any flip-mount or direct die attach interconnect technology may be used, such as a solder bump, a stud bump, a pillar, or other non-wirebond technique. Using bump attachments with the inductive interconnect, the integrated matching networks and methods for manufacturing integrated matching networks provide a cost-effective system for impedance matching.

Figure 1:
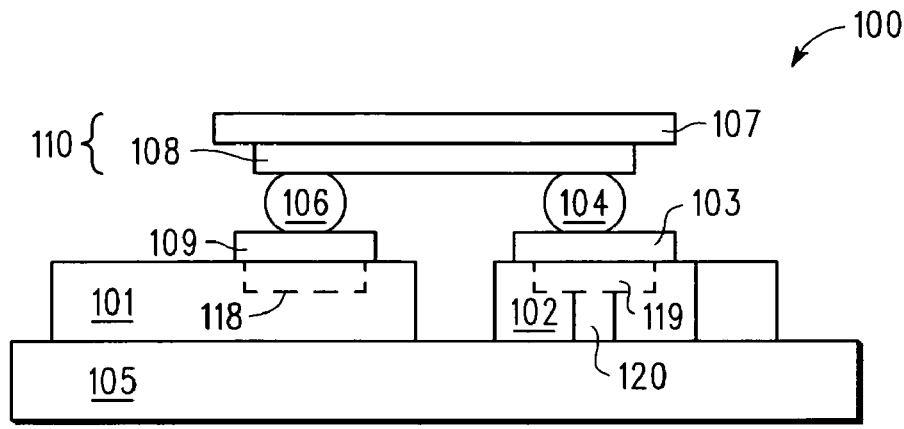
FIG. 1 is a cross-sectional view of an integrated matching network in accordance with an exemplary embodiment of the present invention.

Referring to the drawings, FIG. 1 is a cross-sectional view of an integrated matching network 100 in accordance with an exemplary embodiment of the present invention. The integrated matching network 100 comprises a conductive plate 105 (e.g., a Cu substrate), dies 101 and 102, each coupled to separate areas of conductive plate 105, and an inductive component 110 coupled to first and second dies 101, 102. During manufacture of integrated matching network 100, dies 101 and 102 may be attached to conductive plate 105 using a variety of conventional integrated circuit manufacturing techniques. In one embodiment, first die 101 includes, but is not necessarily limited to, an RF active component 118 (e.g., a PA circuit) formed therein, and second die 102 includes, but is not necessarily limited to, a capacitance circuit 119 formed therein. Conductive plate 105 is coupled to a reference potential (e.g., a ground thereby providing an RF ground for RF active component) suitable to the operation requirements of one or more of the various electronic devices formed on dies 101, 102 and/or other additional dies (not shown) that may be formed on conductive plate 105. In an exemplary embodiment, integrated matching network 100 is part of an RF device having a power amplifier (e.g., for a base station) that amplifies and transmits remote signals although integrated matching network 100 may be part of a variety of other electronic devices for impedance matching with other radio components. The capacitance circuit 119 and inductive component 110 are selected such that the capacitance value of capacitance circuit 119 and the inductance value of inductive component 110 provide the desired matching impedance for the RF device.

In one exemplary embodiment, RF active component 118 is a lateral double-diffused metal oxide semiconductor (LDMOS) device and the capacitance circuit 119 is an integrated passive device (IPD), although RF active component 118 and capacitance circuit 119 may use other integrated circuit devices to provide power amplification and capacitance, respectively. For example, in one embodiment, die 102 is a substrate having passive components integrally formed therewith. The die substrate may be derived from a high resistivity silicon wafer or other insulating or semi-insulating wafer. An exemplary substrate is a GaAs wafer, and a suitable metal/dielectric/metal stack (e.g., Au/SiN/Au or the like) is deposited onto the substrate. For ease of fabrication, the IPD metals are formed from the same materials such as gold, copper, or aluminum in an exemplary embodiment, although a variety of conductive metals may be used.

Each of dies 101 and 102 has opposing surfaces (e.g., a top surface and a bottom surface), and a first surface of each of dies 101 and 102 is coupled to conductive plate 105. The other surface of dies 101 and 102 is used for coupling to inductor component 110. Inductive component 110 includes, but is not necessarily limited to, a substrate 107, or other insulating layer, and a metal interconnect 108 having a first surface coupled to substrate 107. During the fabrication of dies 101 and 102, metal contacts 109, 103 may be formed on dies 101 and 102, respectively. Metal interconnect 108 and metal contacts 109, 103 are formed using lithography, deposition, etching, and plating techniques, although other techniques may be used. Bump attachments 106 and 104 are applied onto or otherwise formed on dies 101 and 102 (e.g., onto metal contacts 109, 103) or applied onto inductive component 110 (e.g., onto metal interconnect 108), although bump attachments 106 and 104 may be applied to dies 101, 102 and inductive component 110 in any order to couple dies 101, 102 with inductive component 110.

Contacts 109 and 103 are coupled to an output of RF active component 118 and an input of capacitance circuit 119, respectively. A via 120 may be formed through die 102 and filled or lined with conductive metal, or other conductive materials, to provide electrical connection between capacitance circuit 119 and conductive plate 105. Via 120 may be formed using a photolithography process, and etched using either dry or wet processes, or through other conventional methods. The via hole is filled or lined with a suitable metal or conductive material. In this configuration, metal interconnect 108 provides a shunt inductance between die 101 and die 102 in series with the capacitance circuit of die 102. Although not shown, additional semiconductor elements or integrated devices may be formed on or coupled to substrate 107.

Figure 2:
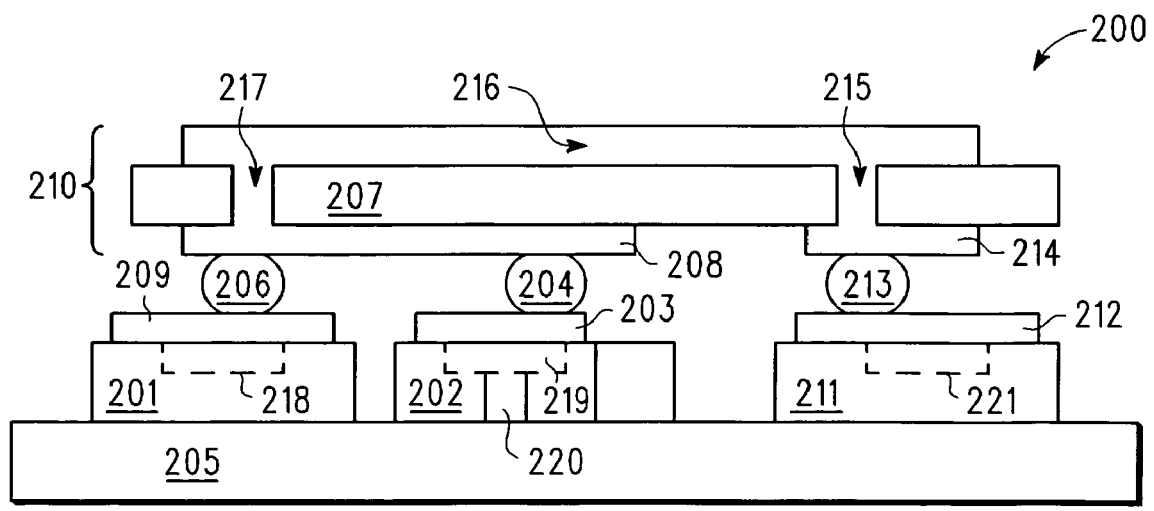
FIG. 2 is a cross-sectional view of an integrated matching network in accordance with another exemplary embodiment of the present invention.

FIG. 2 is a cross-sectional view of an integrated matching network 200 in accordance with another exemplary embodiment of the present invention. Integrated matching network 200 provides a matching impedance having a shunt capacitance, a shunt inductance in series with the shunt capacitance, a second capacitance, and a second inductance in series with the second capacitance. In this exemplary embodiment, integrated matching network 200 comprises a conductive plate 205, dies 201, 202, and 211 each coupled to separate areas of conductive plate 205, and an inductive component 210 formed on dies 201, 202, and 211. Conductive plate 205 is also coupled to a reference potential (e.g., ground) suitable to the operation requirements of one or more of the various electronic devices formed on dies 201, 202, 211 and/or other additional dies (not shown) that may formed on conductive plate 205. Die 201 includes, but is not necessarily limited to, an RF active component 218 (e.g., a PA circuit) formed therein, die 202 includes, but is not necessarily limited to a first capacitance circuit 219 formed therein, and die 211 includes, but is not necessarily limited to, a second capacitance circuit 221 formed therein.

Each of dies 201, 202, and 211 has opposing surfaces, and the first surface of each of dies 201, 202, and 211 is coupled to conductive plate 205. In an exemplary embodiment, inductive component 210 comprises a first metal interconnect 208, a grounded or shielded insulator substrate 207, or other insulator layer, having a first surface coupled to a first surface of metal interconnect 208, and a second metal interconnect 216 coupled to a second surface of insulator substrate 207. Contacts 209, 203, and 212 (e.g., conductive metal contacts) are formed on the second surface of dies 201, 202, and 211, respectively, and are coupled to an output of RF active component 218, and input of capacitance circuit 219, and an input of capacitance circuit 221, respectively. Additionally, a contact 214 is formed on the first surface of insulator substrate 207 at a separate area from metal interconnect 208. Metal interconnects 208, 216 and contacts 209, 203, 212 are formed using lithography, deposition, etching, and plating techniques, although other techniques may be used. Via 220 may be formed through die 202 and filled or lined with conductive metal to couple capacitance circuit 219 with conductive plate 205. Vias 215 and 217 are formed through insulator substrate 207 and filled or lined with a conductive metal. For example, vias 220, 215, and 217 may be formed using a photolithography process to dry or wet etch through the die substrate. The via hole is then filled or lined with a suitable metal or conductive material. Via 217 couples metal interconnects 208 and 209 with metal interconnect 216, and via 215 couples metal interconnect 216 with contact 214.

To couple the inductive component 210 to dies 201, 202, and 211, a second surface (e.g., opposing the first surface of metal interconnect 208) of metal interconnect 208 is coupled to contacts 209 and 203 with bump attachments 206 and 204, respectively, and contact 214 is coupled to contact 212 with a bump attachment 213. In this configuration, metal interconnect 208 provides a shunt inductance between die 201 and die 202 in series with the capacitance of capacitance circuit 219. Additionally, metal interconnect 216 provides an inductance that is coupled in series with the capacitance of capacitance circuit 221. Integrated matching networks 100 (FIG. 1) and 200 are exemplary embodiments, and a variety of inductance and/or capacitance combinations may be used to provide an appropriate matching impedance. For example, additional dies (not shown) having pre-determined capacitances may be formed on conductive plate 205, and inductive substrate 210 may include additional metal interconnects having pre-determined inductances.

Figure 3:
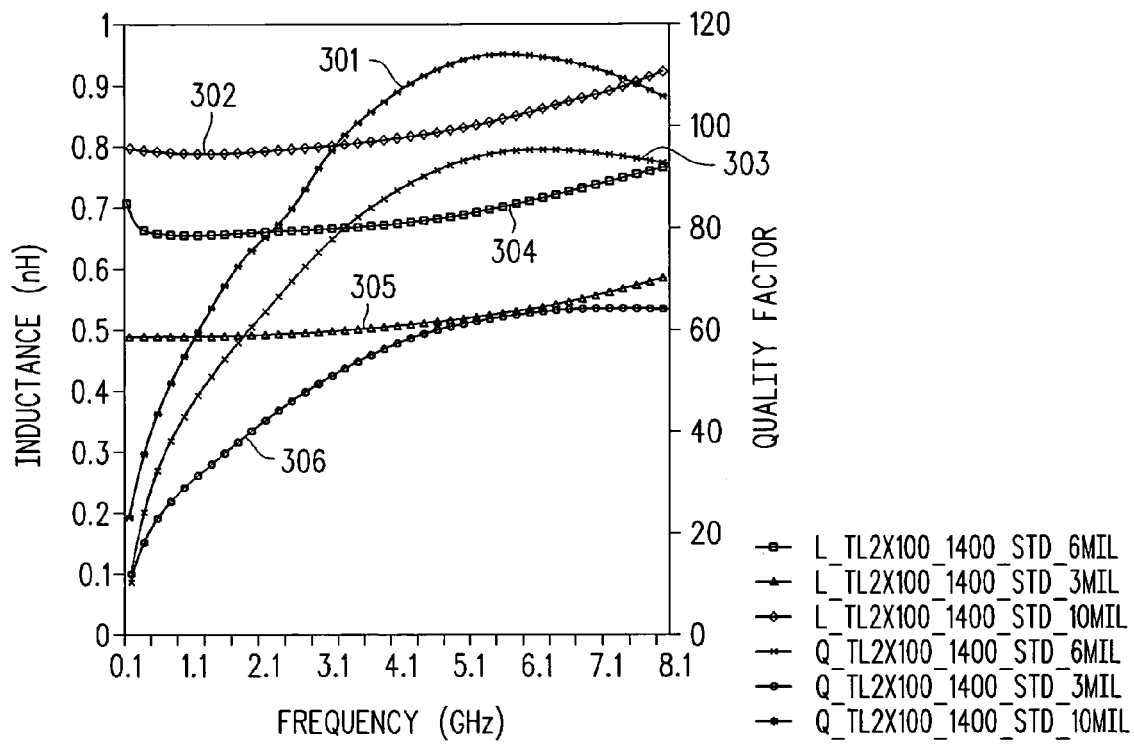
FIG. 3 is graph illustrating wirebond inductance and Q factor in accordance with an exemplary embodiment of the present invention.

FIG. 3 is a graph illustrating inductance and Q factor for a variety of inductor substrate thicknesses. Inductor substrate (e.g., inductive components 110, 210) thicknesses of 3 mil, 6 mil, and 10 mil have inductances 305, 304, and 302, respectively, and Q factors 306, 303, and 301, respectively, that vary in response to the operation frequency of the integrated matching network, such as integrated matching networks 100 and 200. In general, the Q factor and inductance increases with increasing distance from an RF ground, realized by increasing inductor substrate thickness, as shown in FIG. 3. Using metal interconnect 108 with bump attachments 106 and 104 to couple die 101 with die 102 allows for a higher Q inductor by increasing spacing to RF ground (e.g., provided by conductive plate 105).

Figure 4:
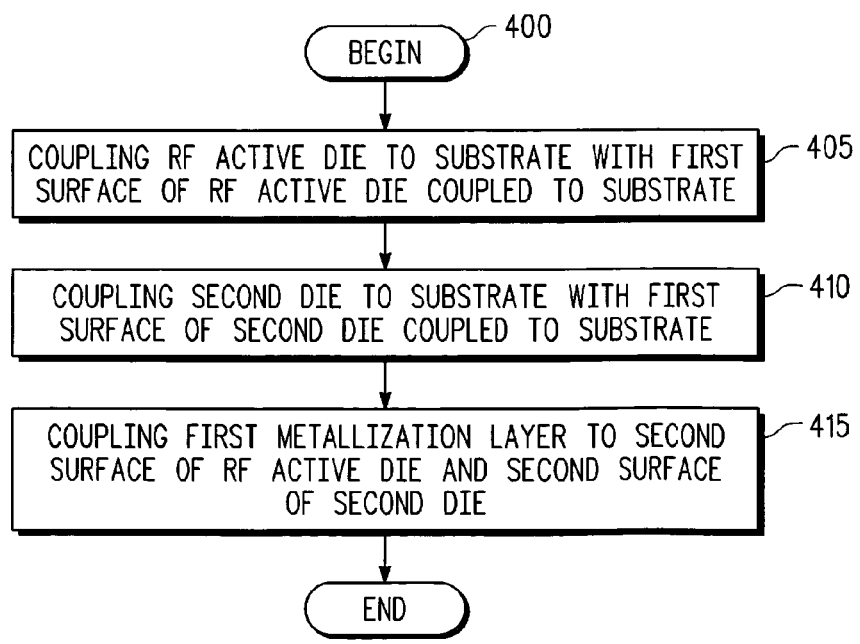
FIG. 4 is a flow diagram of a method for integrating a matching network in an electronic device in accordance with an exemplary embodiment of the present invention.

FIG. 4 is a flow diagram of a method 400 for manufacturing an integrated matching network in accordance with an exemplary embodiment of the present invention. A first die (e.g., die 101, 201) is formed on or coupled to a conductive substrate, as indicated at step 405. For example, die 101 is attached to conductive substrate 105 such that the first surface of die 101 is coupled to conductive substrate 105. The first die includes an RF active component (e.g., a PA). A second die (e.g., die 102, 202) is formed on or coupled to the conductive substrate, as indicated at step 410. For example, the first surface of die 102 is attached to conductive substrate 105 such that the first surface of die 102 is coupled to conductive substrate 105. The second die includes a capacitor device (e.g., an IPD capacitor, a silicon MOS capacitor, or the like). A first metallization layer is coupled to the second surfaces of the first and second die, as indicated at step 415. For example, metal interconnect 108 is coupled to dies 101 and 102. In one exemplary embodiment, the first surface of the first metallization layer is coupled to the second surfaces of the first and second dies with bump attachments (e.g., bump attachments 106, 104). For example, metal contacts (e.g., metal contacts 109, 103) are formed on the second surfaces of the first and second dies, and the metallization layer is coupled to the metal contacts on the first and second dies with bump attachments. The metal interconnect 108 has an inductance which can be selected, in combination with the capacitance of the second die, to provide a matching impedance.

In another exemplary embodiment, a third die (e.g., die 211) is formed on or coupled to the conductive substrate (e.g., conductive plate 205) and an inductive component (e.g., inductive component 210) is formed. For example, die 211 is attached to conductive substrate 205 such that the first surface of die 211 is coupled to conductive substrate 205. The third die includes a capacitor device (e.g., a second IPD capacitor, silicon MOS capacitor, or the like). To form the inductive component, one or more vias are formed through a substrate. For example, first and second vias 217 and 215 are formed through insulator substrate 207 and filled or lined with conductive metal. Two metallization layers (e.g., a first metallization layer comprising metal interconnect 208 and metal contact 214 and a second metallization layer comprising metal interconnect 216) are formed on the substrate (e.g., insulator substrate 207) such that the first surface of the insulator substrate is coupled to the first metallization layer and the second surface of the insulator substrate is coupled to the second metallization layer. These metallization layers may be patterned by any of a variety of methods (e.g., photolithography, etching, and the like). Metal interconnect 216 is formed on the second surface of insulator substrate 207 and coupled to metal interconnect 208 with via 217. A metal contact (e.g., metal contact 214) is additionally formed on the first surface of the insulator substrate and coupled to the second metallization layer with the second via. For example, contact 214 is formed on the first surface of insulator substrate 207. Bump attachments (e.g., bump attachments 206 and 204) couple the first and second dies (e.g., dies 201 and 202) to the first metallization layer (e.g., metal interconnect 208). Additionally, a bump attachment couples the third die to the second metallization layer (e.g., metal interconnect 216 is coupled to die 211 using via 215, contact 214, and bump attachment 213). A metal contact (e.g., 212) may also be formed on the third die 211. The first and second metallization layers may be selected, in combination with the capacitance of the second and third dies, to provide a matching impedance.

The first and second metallization layers and insulator substrate may be formed together prior to coupling with the first, second, and third dies. For example, metal interconnect 216 may be formed on one surface of insulator substrate 207 and vias 217, 215 are subsequently formed through insulator substrate 207 and filled or lined with conductive metal. Then, metal interconnect 208 and contact 214 are formed on the other surface (e.g., the other opposing surface) of insulator substrate 207 at separate areas (e.g., metal interconnect 208 and contact 214 are coupled to metal interconnect 216 by vias 217 and 215, respectively) to produce an inductor substrate unit. This inductor substrate unit is then coupled to dies 201, 202, and 211 with bump attachments 206, 204, and 213, respectively, such that metal interconnect 208 is coupled to dies 201 and 202 and contact 214 is coupled to die 211.

In general, the illustrated integrated matching networks improve matching impedance reproducibility by substituting metal interconnects and bump attachments for conventional wire-bonding techniques, without sacrificing the amount of inductance that wire bonds typically provide. Lower manufacturing costs are achieved by partitioning the manufacturing process step of the integrated matching network 100, 200. For example, capacitor processing on inductive component 110, 210 is not required, and the IPD capacitor (e.g., capacitor circuits 119, 219, and 221 provided by dies 102, 202, and 211, respectively) is generally smaller without an integrated inductor. Increasing spacing to ground with inductive component 110, 210 improves the Q factor of the integrated matching network.

In one exemplary embodiment, a method for manufacturing an integrated matching network is provided comprising coupling a first die to a substrate, coupling a second die to the substrate, and coupling a first metallization layer to a second surface of the first die and a second surface of the second die. The first die has first and second opposing surfaces, and the first surface of the first die is coupled to the substrate. The second die has first and second opposing surfaces, and the first surface of the second die is coupled to the substrate. The second die has a capacitance, the first metallization layer has an inductance, and the capacitance and inductance together provide a shunt impedance from the first die to the substrate. The step of coupling a first die comprises coupling an RF active component to the substrate, and coupling a second die comprises coupling a capacitor to the substrate. The step of coupling a first metallization layer comprises coupling the second surface of the first die to the first metallization layer with a first bump attachment, and coupling the second die to the first metallization layer with a second bump attachment. The method may further comprise coupling a third die to the substrate, and coupling the third die to the first die with a second metallization layer. The step of coupling the third die to the first die comprises coupling the first metallization layer to the second metallization layer with a first via, and coupling the third die to the second metallization layer with a second via. The method may further comprise coupling a third die on the substrate, forming the first metallization layer on an insulator layer, forming first and second vias through the insulator layer, and forming a second metallization layer on the insulator layer. The first via couples the second metallization layer to the first metallization layer, and the second via couples the second metallization layer to the third die.

In another exemplary embodiment, a method for manufacturing an RF device having an integrated matching network is provided comprising coupling an RF active die to a first substrate such that a first surface of the RF active die is coupled to the first substrate, coupling a first integrated passive device (IPD) to the first substrate such that a first surface of the first IPD is coupled to the first substrate, and coupling a second substrate to a second surface of the RF active die and a second surface of the first IPD. The first and second surfaces of the RF active die are opposing surfaces, and the first and second surfaces of the first IPD are opposing surfaces. The first IPD has a first capacitance incorporated therewith. The second substrate having an inductance. In one exemplary embodiment, the RF device has an output and an RF ground. The first capacitance and inductance together form a shunt impedance from the output of the RF device to the RF ground. In one exemplary embodiment, the step of coupling a second substrate comprises coupling a metal interconnect to the first surface of the RF active die and the first surface of the first IPD, and the metal interconnect has the inductance. In another exemplary embodiment, the step of coupling a second substrate comprises applying a first bump attachment to the second surface of the die, applying a second bump attachment to the second surface of the first IPD, and coupling a metal interconnect to the first and second bump attachments. In another exemplary embodiment, the step of coupling a second substrate comprises forming a first contact on the second surface of the RF active die, applying a first bump attachment to the first contact, forming a second contact on the second surface of the first IPD, applying a second bump attachment to the second contact, and coupling a metal interconnect to the first and second bump attachments. In an exemplary embodiment, the method may further comprise coupling a second IPD to the first substrate, the second IPD having first and second opposing surfaces, and the step of coupling a second substrate comprises coupling the second substrate to the second surface of the RF active die, the second surface of the first IPD, and the second surface of the second IPD. In another exemplary embodiment, the method may further comprise coupling a second IPD on the first substrate. The second IPD has first and second opposing surfaces, and the first surface of the second IPD is coupled to the first substrate. In this exemplary embodiment, the step of coupling a second substrate comprises applying a first bump attachment to the second surface of the RF active die, applying a second bump attachment to the second surface of the first IPD, coupling a first metal interconnect to the first and second bump attachments, applying a third bump attachment to the second surface of the second IPD, and coupling a second metal interconnect to the bump attachment and the third bump attachment. In this exemplary embodiment, the first metal interconnect has a first inductance, the second metal interconnect has a second inductance. The first inductance and first capacitance form a shunt impedance to the RF ground. The second IPD has a second capacitance, and the second inductance and the second capacitance coupled to the shunt impedance to the RF ground together form the output impedance matching network. In another exemplary embodiment, the method may further comprise forming a second IPD on the first substrate. The second IPD has first and second opposing surfaces, and the first surface of the second IPD is coupled to the first substrate. In this exemplary embodiment, the step of coupling a second substrate comprises forming a first metallization layer on an insulator substrate, forming first and second vias through the insulator substrate, forming a second metallization layer on the insulator substrate, coupling the second metallization layer to the second surface of the RF active die and the second surface of the first IPD while coupling the first metallization layer to the second surface of the second IPD with the second via. The second metallization layer is coupled to the first metallization layer with the first via.

In another exemplary embodiment, an integrated matching network is provided comprising a first die comprising an RF active component, a second die comprising first capacitor, and a first metal interconnect coupled to the RF active component and the first capacitor. The first metal interconnect has a first inductance, and the first inductance and first capacitor form a shunt impedance. The integrated matching network further comprises a first bump attachment coupled to the RF active component, and a second bump attachment coupled to the first capacitor. The metal interconnect is coupled to the first and second bump attachments. The RF active component comprises a PA, and the first capacitor is an IPD. The integrated matching network further comprises a third die comprising a second capacitor, and a second metal interconnect coupled to the first metal interconnect and the second capacitor. The integrated matching network further comprises an inductor substrate coupled to the first and second dies. The inductor substrate comprises a first contact coupled to the RF active component, a second contact coupled to the first capacitor, a first bump attachment coupled to the first contact, and a second bump attachment coupled to the second contact. The first metal interconnect is coupled to the first and second bump attachments. The first metal interconnect has first and second opposing surfaces. The integrated matching network further comprises a third die comprising a second capacitor coupled to the shunt impedance, and an inductive component coupled to the first, second, and third dies, a first bump attachment coupled to the RF active component, a second bump attachment coupled to the first capacitor, and a third bump attachment coupled to the second capacitor. The inductive component comprises an insulating layer having first and second opposing surfaces and first and second vias, and a second metal interconnect coupled to the second surface of the insulating layer. The second metal interconnect has a second inductance, and the second inductance and the second capacitor coupled to the shunt impedance together form an output impedance matching network. The first surface of the first metal interconnect is coupled to the first and second bump attachments. The first surface of the insulating layer is coupled to the second surface of the first metal interconnect. The first via couples the second metal interconnect to the second surface of the first metal interconnect, and the second via couples the second metal interconnect to the third bump attachment.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for manufacturing a radio frequency (RF) device having an integrated matching network, the method comprising the steps of:
   coupling a first die in which a power amplifier circuit is formed to a first substrate, the first die having a first surface, a second opposing surface, and an output of the power amplifier circuit, and wherein the first surface of the first die is coupled to the first substrate;
   coupling a second die in which a first integrated passive device (IPD) is formed to the first substrate, the second die having a first surface, a second opposing surface, and an input to the first IPD, wherein the first IPD has a first capacitance, and the first surface of the second die is coupled to the first substrate; and
   coupling a first metal interconnect formed on a second substrate between the second surface of the first die and the second surface of the second die in order to couple the output of the power amplifier circuit with the input to the first IPD, wherein the first metal interconnect has a first inductance that is coupled in series with the first capacitance, and wherein the first inductance and the first capacitance provides a matching impedance for the power amplifier circuit.

2. A method according to claim 1, wherein said step of coupling the first metal interconnect comprises:
   forming a first contact on the second surface of the first die;
   applying a first bump attachment to the first contact;
   forming a second contact on the second surface of the second die;
   applying a second bump attachment to the second contact; and
   coupling the first metal interconnect to the first and second bump attachments.

3. A method according to claim 1, further comprising:
   coupling a third die in which a second IPD is formed to the first substrate, the third die having a first surface, a second opposing surface, and an input to the second IPD; and
   coupling a second metal interconnect formed on the second substrate between the second surface of the first die and the second surface of the third die in order to couple the output of the power amplifier circuit with the input to the second IPD, wherein the second metal interconnect has a second inductance that is coupled in series with the second capacitance, the first inductance and the first capacitance are coupled in parallel with the second inductance and the second capacitance, and wherein the first inductance, the first capacitance, the second inductance, and the second capacitance provides the matching impedance for the power amplifier circuit.

4. A method according to claim 3, wherein said step of coupling the first metal interconnect comprises:
   applying a first bump attachment to the second surface of the first die;
   applying a second bump attachment to the second surface of the second die; and
   coupling the first metal interconnect to the first and second bump attachments, and wherein said step of coupling the second metal interconnect comprises:
   applying a third bump attachment to the second surface of the third die; and
   coupling the second metal interconnect to the first bump attachment and the third bump attachment.

5. A method according to claim 3, further comprising:
   forming a first metallization layer on a first surface of the second substrate to form the first metal interconnect and the second metal interconnect;
   forming first and second vias through the insulator substrate; and
   forming a second metallization layer on the insulator substrate, the second metallization layer coupled to the first metal interconnect with the first via, and the second metallization layer coupled to the second metal interconnect with the second via.

6. A method for manufacturing an integrated matching network, the method comprising the steps of:
   coupling a first die to a substrate, the first die having first and second opposing surfaces, the first surface of the first die coupled to the substrate;
   coupling a second die to the substrate, the second die having first and second opposing surfaces and a capacitance, the first surface of the second die coupled to the substrate; and
   coupling a first metallization layer of an inductive component to the second surface of the first die and the second surface of the second die, the first metallization layer having an inductance, the capacitance and the inductance together providing a shunt impedance from the first die to the substrate, wherein the inductive component includes an insulator substrate and the first metallization layer coupled to the insulator substrate.

7. A method according to claim 1, wherein said step of coupling a first die comprises forming an RF active component on the substrate; and wherein said step of forming a second die comprises forming a capacitor on the substrate.

8. A method according to claim 1, wherein said step of coupling a first metallization layer comprises:
   coupling the second surface of the first die to the first metallization layer with a first bump attachment; and
   coupling the second die to the first metallization layer with a second bump attachment.

9. A method according to claim 1 further comprising:
   coupling a third die on the substrate; and
   coupling the third die to the first die with a second metallization layer.

10. A method according to claim 9, wherein said step of coupling the third die to the first die comprises:
    coupling the first metallization layer to the second metallization layer with a first via; and
    coupling the third die to the second metallization layer with a second via.

11. A method according to claim 1 further comprising:
    coupling a third die to the substrate;
    forming the first metallization layer on an insulator layer;
    forming first and second vias through the insulator layer; and
    forming a second metallization layer on the insulator layer, the first via coupling the second metallization layer to the first metallization layer, the second via coupling the second metallization layer to the third die.

12. A method for manufacturing a radio frequency (RF) device having an integrated matching network, the method comprising the steps of:
    coupling an RF active die to a first substrate, the RF active die having first and second opposing surfaces, an RF active component, and an output of the RF active component, the first surface of the RF active die coupled to the first substrate;
    coupling a first integrated passive device (IPD) to the first substrate, the first IPD having first and second opposing surfaces, a first capacitance incorporated therewith, and a input, the first surface of the first IPD coupled to the first substrate; and coupling a first metal interconnect formed on a second substrate between the second surface of the die and the second surface of the first IPD in order to couple the output of the RF active component with the input of the first IPD, wherein the first metal interconnect has an inductance that is coupled in series with the first capacitance, and wherein the inductance and the first capacitance provide a matching impedance for the RF active component.

13. A method according to claim 12, wherein the RF device has an RF ground; and wherein the first capacitance and the inductance together provide a shunt impedance from the output of the RF active component to the RF ground.

14. A method according to claim 12, wherein said step of coupling a second substrate comprises coupling the first metal interconnect to the second surface of the RF active die and the second surface of the first IPD. interconnect having the inductance.

15. A method according to claim 12, wherein said step of coupling a second substrate comprises:
   applying a first bump attachment to the second surface of the RF active die;
   applying a second bump attachment to the second surface of the first IPD; and
   coupling the first metal interconnect to the first and second bump attachments.

16. A method according to claim 12, wherein said step of coupling a second substrate comprises:
   forming a first contact on the second surface of the RF active die;
   applying a first bump attachment to the first contact;
   forming a second contact on the second surface of the first IPD;
   applying a second bump attachment to the second contact; and
   coupling the first metal interconnect to the first and second bump attachments.

17. A method according to claim 12 further comprising coupling a second IPD to the first substrate, the second IPD having first and second opposing surfaces; and
   wherein said step of coupling a second substrate comprises coupling the second substrate to the second surface of the RF active die, the second surface of the first IPD, and the second surface of the second IPD.

18. A method according to claim 12 further comprising coupling a second IPD to the first substrate, the second IPD having first and second opposing surfaces, the first surface of the second IPD coupled to the first substrate; and wherein said step of coupling a second substrate comprises:
   applying a first bump attachment to the second surface of the RF active die;
   applying a second bump attachment to the second surface of the first IPD;
   coupling the first metal interconnect to the first and second bump attachments;
   applying a third bump attachment to the second surface of the second IPD; and
   coupling a second metal interconnect to the first bump attachment and the third bump attachment.

19. A method according to claim 18, wherein the RF device has an RF ground; wherein the first metal interconnect has a first inductance and the second metal interconnect has a second inductance; wherein the first inductance and the first capacitance form a shunt impedance to the RF ground; wherein the second IPD has a second capacitance coupled to the shunt impedance to the RF ground; and wherein the second inductance and the second capacitance coupled to the shunt impedance to the RF ground together form an output impedance matching network.

20. A method according to claim 12 further comprising coupling a second IPD to the first substrate, the second IPD having first and second opposing surfaces, the first surface of the second IPD coupled to the first substrate; and wherein said step of coupling a second substrate comprises:
   forming a first metallization layer on an insulator substrate to form the first metal interconnect;
   forming first and second vias through the insulator substrate;
   forming a second metallization layer on the insulator substrate, the second metallization layer coupled to the first metallization layer with the first via;
   coupling the second metallization layer to the second surface of the RF active die and the second surface of the first IPD while coupling the first metallization layer to the second surface of the second IPD with the second via.

* * * * *

UNITED STATES PATENT AND TRADEMARK OFFICE
CERTIFICATE OF CORRECTION

| | | |
|---|---|---|
| PATENT NO. | : 7,528,062 B2 | Page 1 of 1 |
| APPLICATION NO. | : 11/586807 | |
| DATED | : May 5, 2009 | |
| INVENTOR(S) | : Miller et al. | |

It is certified that error appears in the above-identified patent and that said Letters Patent is hereby corrected as shown below:

Column 11, lines 17-21, claim 14 should read as follows: "A method according to claim 12, wherein said step of coupling a second substrate comprises coupling the first metal interconnect to the second surface of the RF active die and the second surface of the first IPD"

Signed and Sealed this

Third Day of November, 2009

David J. Kappos
*Director of the United States Patent and Trademark Office*